United States Patent
Shu (10) Patent No.: US 9,385,744 B2
(45) Date of Patent: Jul. 5, 2016

(54) DELTA-SIGMA ANALOG-TO-DIGITAL CONVERTER WITH ERROR SUPPRESSION

(71) Applicant: MEDIATEK INC., Hsin-Chu (TW)

(72) Inventor: Yun-Shiang Shu, Hsinchu County (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/016,246

(22) Filed: Sep. 3, 2013

(65) Prior Publication Data
US 2014/0070969 A1 Mar. 13, 2014

Related U.S. Application Data

(60) Provisional application No. 61/698,456, filed on Sep. 7, 2012.

(51) Int. Cl.
*H03M 3/00* (2006.01)

(52) U.S. Cl.
CPC .............. *H03M 3/322* (2013.01); *H03M 3/388* (2013.01); *H03M 3/458* (2013.01)

(58) Field of Classification Search
CPC ............................................ H03M 3/37–3/376
USPC ................................................... 341/118, 143
See application file for complete search history.

(56) References Cited

U.S. PATENT DOCUMENTS

| | | | | |
|---|---|---|---|---|
| 5,838,272 A | * | 11/1998 | Steiner et al. | 341/143 |
| 6,522,276 B2 | * | 2/2003 | Andre et al. | 341/143 |
| 6,993,464 B2 | * | 1/2006 | Chiu et al. | 703/2 |
| 7,098,829 B2 | * | 8/2006 | Westra | H03K 17/693 341/136 |
| 7,158,062 B2 | * | 1/2007 | Cosand | H03M 3/376 341/133 |

OTHER PUBLICATIONS

Shu, Y-S. et al., A 28fJ/conv-step CT ΔΣ Modulator with 78dB DR and 18MHz BW in 28nm CMOS Using a Highly Digital Multibit Quantizer, 2013 IEEE International Solid-State Circuits Conference Digest of Technical Papers (ISSCC), Feb. 2013, pp. 268-269.*
Witte, P. et al., Hardware Complexity of a Correlation Based Background DAC Error Estimation Technique for Sigma-Delta ADCs, Proceedings of 2010 IEEE International Symposium on Circuits and Systems (ISCAS), May 30, 2010-Jun. 2, 2010, pp. 2167-2170.*
Crochiere et al., Interpolation and Decimation of Digital Signals—A Tutorial Review, Proceedings of the IEEE, vol. 69, No. 3, Mar. 1981, pp. 300-331.*
Cataltepe, Digitally Corrected Multi-Bit Sigma-Delta Data Converters, pp. 647-650, ISCAS 1989, 1989.

(Continued)

*Primary Examiner* — Howard Williams
(74) *Attorney, Agent, or Firm* — Winston Hsu; Scott Margo (57) ABSTRACT

A delta-sigma analog-to-digital converter (ΔΣ ADC) has a delta-sigma modulator, a decimation filter and an error suppression circuit. The delta-sigma modulator receives an analog input, and converts the analog input into a first digital output. The decimation filter is coupled to the delta-sigma modulator, and generates a second digital output according to the first digital output. The error suppression circuit is coupled to the decimation filter, and receives an error input and injects an error output into the second digital output according to the error input.

15 Claims, 5 Drawing Sheets

(56) References Cited

OTHER PUBLICATIONS

Kauffman, An 8.5 mW Continuous-Time Delta-Sigma Modulator With 25 MHz Bandwidth Using Digital Background DAC Linearization to Achieve 63.5 dB SNDR and 81 dB SFDR, Dec. 2011.

Witte, Background DAC Error Estimation Using a Pseudo Random Noise Based Correlation Technique for Sigma-Delta Analog-to-Digital Converters, IEEE Transactions on Circuits and Systems—I: Regular Papers, pp. 1500-1512, vol. 57, No. 7, Jul. 2010.

* cited by examiner

DELTA-SIGMA ANALOG-TO-DIGITAL CONVERTER WITH ERROR SUPPRESSION

CROSS REFERENCE TO RELATED APPLICATIONS

This application claims the benefit of U.S. provisional application No. 61/698,456, filed on Sep. 7, 2012 and incorporated herein by reference.

BACKGROUND

The disclosed embodiments of the present invention relate to converting an analog signal into a digital signal, and more particularly, to a delta-sigma analog-to-digital converter with error suppression.

Analog techniques have dominated signal processing for years, but digital techniques are encroaching into this domain. An analog-to-digital converter is needed to convert an analog signal into a digital signal, thus allowing the signal to be processed in a digital domain. For example, a delta-sigma analog-to-digital converter (ΔΣ ADC) may be used for converting analog signals over a wide range of frequencies, from DC (direct current) to several megahertz. In general, a core part of the delta-sigma analog-to-digital converter is a delta-sigma modulator which is responsible for digitizing the analog input signal and reducing noise at lower frequencies. In this stage, the architecture implements a function called noise shaping that pushes low-frequency noise (e.g., quantization noise) up to higher frequencies outside the in-band (i.e., the band of interest). Noise shaping is one of the reasons that the delta-sigma analog-to-digital converters are well-suited for low-frequency, higher-accuracy applications.

The delta-sigma modulator is composed of an adder (which may be implemented using an operational amplifier to perform signal subtraction), a loop filter, an ADC, and a digital-to-analog converter (DAC). The DAC is located at a feedback path between an input node of the adder and an output node of the ADC. Thus, an error of the DAC is injected into the adder, and may be regarded as an input signal of the delta-sigma modulator. As a result, the DAC error can not be suppressed via noise shaping of the delta-sigma modulator. Thus, an error suppression mechanism is needed to mitigate the effect caused by an error injected into the input of the delta-sigma modulator.

SUMMARY

In accordance with exemplary embodiments of the present invention, a delta-sigma analog-to-digital converter (ΔΣ ADC) with error suppression is proposed to solve the above problem.

According to a first aspect of the present invention, an exemplary delta-sigma analog-to-digital converter (ΔΣ ADC) is provided. The exemplary delta-sigma analog-to-digital converter includes a delta-sigma modulator, a first decimation filter and an error suppression circuit. The delta-sigma modulator is arranged for receiving an analog input and converting the analog input into a first digital output. The first decimation filter is coupled to the delta-sigma modulator, and arranged for generating a second digital output according to the first digital output. The error suppression circuit is coupled to the first decimation filter, and arranged for receiving an error input and injecting an error output into the second digital output according to the error input.

According to a second aspect of the present invention, an exemplary delta-sigma analog-to-digital converter (ΔΣ ADC) is provided. The exemplary delta-sigma analog-to-digital converter includes a delta-sigma modulator, a first signal processing circuit and an error suppression circuit. The delta-sigma modulator is arranged for receiving an analog input and converting the analog input into a first digital output. The first signal processing circuit is coupled to the delta-sigma modulator, and arranged for generating a second digital output according to the first digital output. The error suppression circuit is coupled to the first signal processing circuit, and arranged for receiving an error input and injecting an error output into the second digital output according to the error input, wherein the error input is an error resulting from the delta-sigma modulator.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
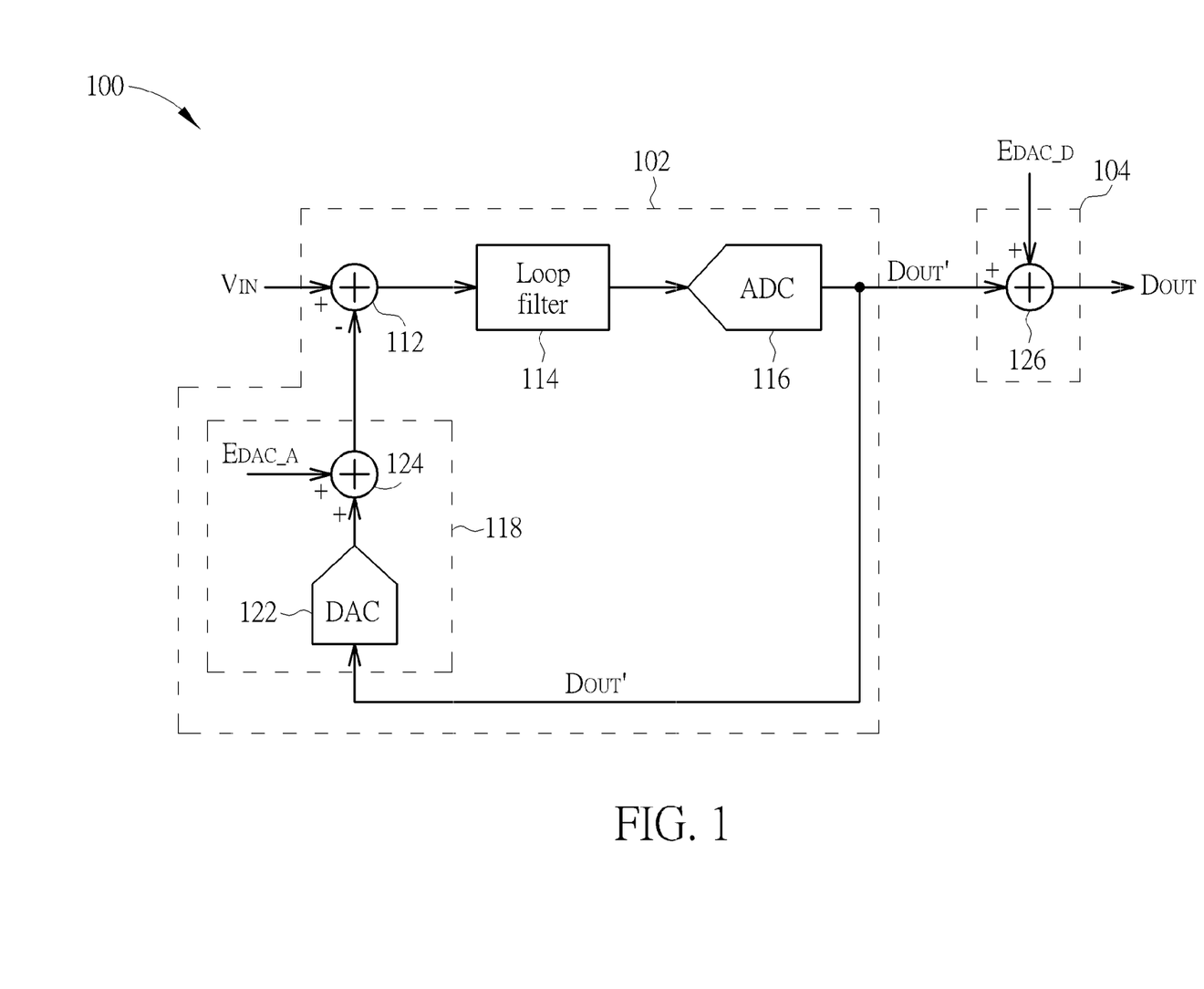
FIG. 1 is a diagram illustrating an exemplary delta-sigma analog-to-digital converter with error suppression.

FIG. 1 is a diagram illustrating an exemplary delta-sigma analog-to-digital converter with error suppression. The delta-sigma analog-to-digital converter 100 includes a delta-sigma modulator 102 and an error suppression circuit 104. The delta-sigma modulator 102 includes an adder 112 (which may be implemented using a difference amplifier to perform signal subtraction), a loop filter 114 (which may include one or more integrators), an analog-to-digital converter (ADC) 116, and a digital-to-analog converter (DAC) 118. The delta-sigma modulator 102 is arranged for receiving an analog input $V_{IN}$, and converting the analog input $V_{IN}$ into a digital output $D_{OUT}'$. As a person skilled in the art should readily understand the operational principle of the delta-sigma modulator 102, further description is omitted here for brevity.

As shown in FIG. 1, the DAC 118 is located at a feedback path between an output node of the ADC 116 and one input node of the adder 112, an error of the DAC 118 may serve as an input injected into the delta-sigma modulator 102. The DAC 118 may be modeled by a DAC 122 and an adder 124, where the DAC error $E_{DAC\_A}$ introduced by the DAC 122 is present at an output node of the DAC 122, and added to the DAC output by the adder 124. For example, the DAC error may result from DAC mismatch (i.e., mismatch between DAC units of the DAC 122). The error suppression circuit 104 is arranged for realizing the DAC error shaping by means of characteristics of the loop filter 114. More specifically, with the help of the error suppression circuit 104 coupled to the delta-sigma modulator 102, the DAC error $E_{DAC\_A}$ introduced by the DAC 122 would be shaped by the noise transfer function of the delta-sigma modulator 102 such that a error-suppressed digital output $D_{OUT}$ is generated. As shown in FIG. 1, the error suppression circuit 104 is implemented by an adder 126 configured to add an error input $EDAC\_D$ to the digital output $D_{OUT}'$ of the preceding delta-sigma modulator 102. It should be noted that the DAC error $E_{DAC\_A}$ may be measured by any feasible means, and the error input $EDAC\_D$ is a digitized version of the measured DAC error $E_{DAC\_A}$.

Figure 2:
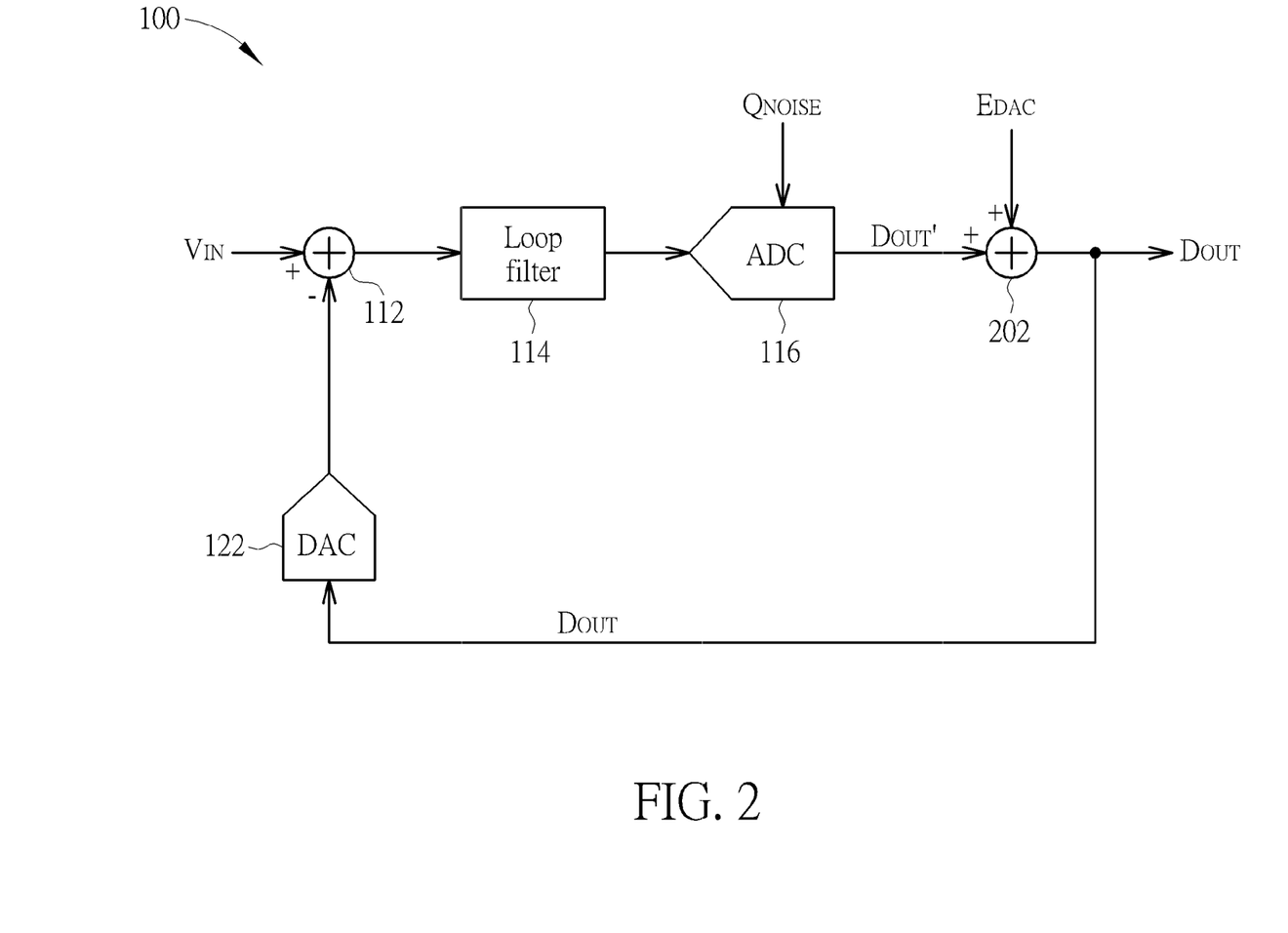
FIG. 2 is a diagram illustrating an equivalent circuit of the delta-sigma analog-to-digital converter shown in FIG. 1.

For a DAC error (e.g., DAC mismatch) injected into the input of the delta-sigma module 102, if it is compensated at the digital output in the same sampling period, its behavior is equivalent to the same error injected right after the ADC 116 and shaped by the noise transfer function of the delta-sigma module 102. Please refer to FIG. 2, which is a diagram illustrating an equivalent circuit of the delta-sigma analog-to-digital converter 100 shown in FIG. 1. The adder 202 in the equivalent circuit is part of the loop. Hence, the adder 202 adds the error input $E_{DAC}$ (which is equivalent to the DAC error of the DAC 122) to the digital output $D_{OUT}'$, and the resultant digital output $D_{OUT}$ is fed back to the DAC 122. Supposing the loop filter 114 has a frequency response H and the ADC 116 has quantization noise $Q_{NOISE}$, the digital output $D_{OUT}$ may be represented using the following equation.

$$D_{OUT} = \frac{H}{1+H}V_{IN} + \frac{1}{1+H}Q_{NOISE} + \frac{1}{1+H}E_{DAC} \quad (1)$$

In general, the frequency response H of the loop filter 114 is designed to have a large gain for a low-frequency range (i.e., frequency range of the in-band). Thus, regarding the in-band (i.e., the band of interest), the desired signal components derived from the analog input $V_{IN}$ are preserved, and the undesired signal components introduced by quantization noise $Q_{NOISE}$ and DAC error $E_{DAC}$ are suppressed. In general, the signal transfer function (STF) and noise transfer function (NTF) of a delta-sigma modulator are defined as follows.

$$STF = \frac{H}{1+H} \quad (2)$$

$$NTF = \frac{1}{1+H} \quad (3)$$

Hence, the digital output $D_{OUT}$ can also be represented by the following equation by substituting STF and NTF into above equation (1).

$$D_{OUT} = STF \cdot V_{IN} + NTF \cdot Q_{NOISE} + NTF \cdot E_{DAC} \quad (4)$$

Hence, as can be seen from equation (4), the DAC error $E_{DAC}$ is shaped by NTF of the delta-sigma modulator 102. An error-suppressed digital output $D_{OUT}$ is generated from the delta-sigma analog-to-digital converter 100 due to injecting the same error into the digital output.

The oversampling delta-sigma modulation is a proven method to realize high and very high-resolution analog-to-digital converters. However, when the oversampling technique is employed by the ADC 116, the digital output $D_{OUT}'$ would have a high sampling rate. The adder 126 is therefore required to perform the summation at the high sampling rate. As a result, the adder 126 requires a complex hardware implementation, and consumes more power inevitably. Because of the use of oversampling in the sigma-delta modulator, the need arises for changing a high input sampling rate to a low output data rate. This is generally achieved by decimation (sample reduction) realized by a decimation filter. As the DAC error $E_{DAC\_D}$ is generally a small decimal number, doing the summation of the DAC error $E_{DAC\_D}$ and the digital output $D_{OUT}'$ before the decimation filter would increase decimation filter's word length. To avoid summation at high sampling rate and/or to reduce decimation filter's word length, the present invention proposes an improved error suppression mechanism.

Figure 3:
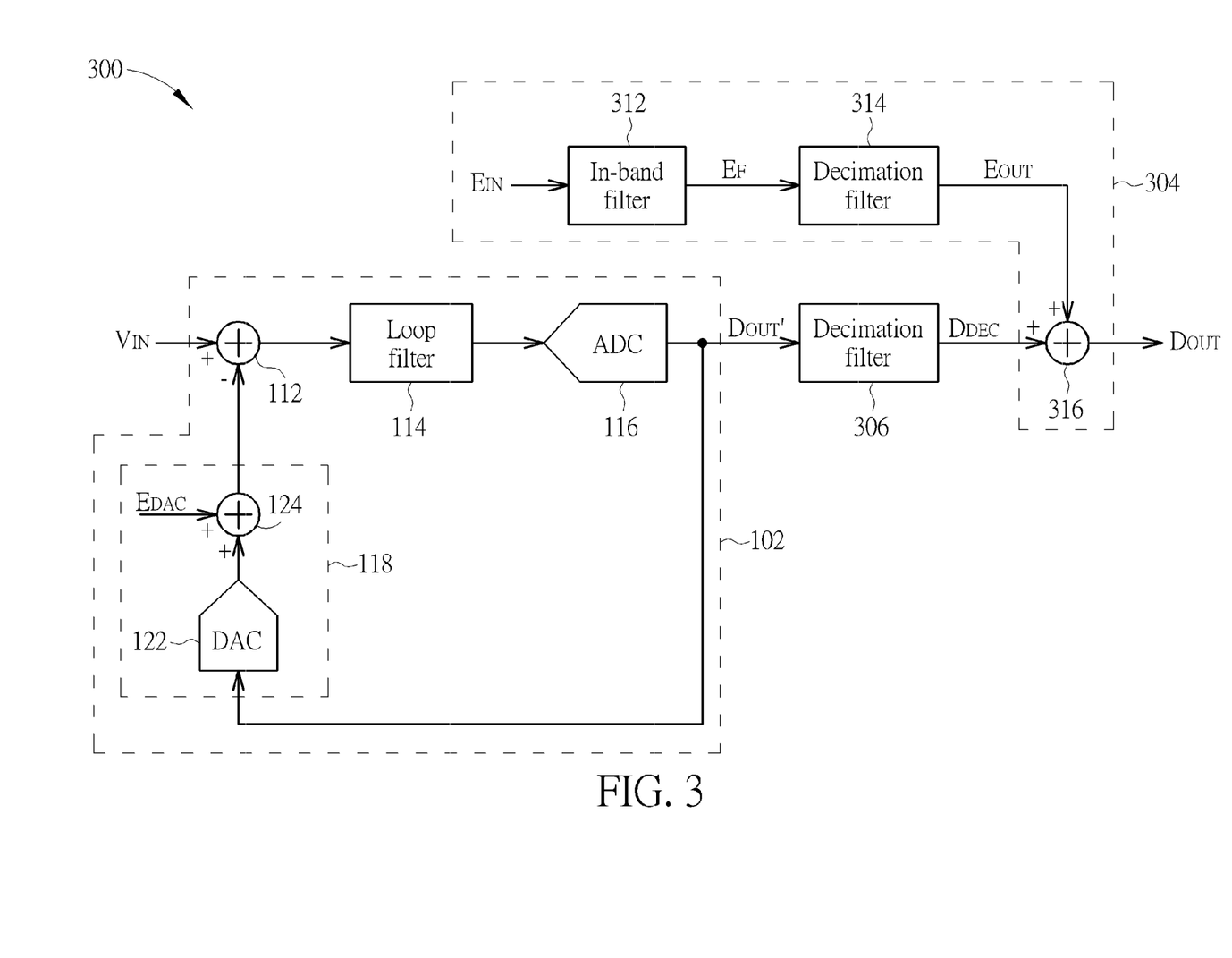
FIG. 3 is a diagram illustrating an oversampling delta-sigma analog-to-digital converter with error suppression according to an embodiment of the present invention.

Please refer to FIG. 3, which is a diagram illustrating an oversampling delta-sigma analog-to-digital converter with error suppression according to an embodiment of the present invention. The delta-sigma analog-to-digital converter 300 includes an error suppression circuit 304, a decimation filter 306, and the aforementioned delta-sigma modulator 102. The decimation filter 306 is coupled to the delta-sigma modulator 102, and arranged for generating a digital output $D_{DEC}$ according to the digital output $D_{OUT}'$. It should be noted that the decimation filter 306 may have a digital filter function (e.g., a low-pass averaging filter function) also implemented therein for noise reduction. However, this is not meant to be a limitation of the present invention. The decimation filter 306 may generate the digital output $D_{DEC}$ by discarding some of the samples in the digital output $D_{OUT}'$. In this way, a high input sampling rate is reduced to a low output date rate through decimation (sample reduction).

The error suppression circuit 304 is coupled to the decimation filter 306, and arranged for receiving an error input $E_{IN}$ and injecting an error output $E_{OUT}$ into the digital output $D_{DEC}$ according to the error input $E_{IN}$. In this embodiment, the error input $E_{IN}$ is an error resulting from the delta-sigma modulator 102. However, this is not meant to be a limitation of the present invention. Any error injected into the modulator input can be suppressed. That is, no matter whether the error input $E_{IN}$ is an error resulting from the delta-sigma modulator 102 or not, any delta-sigma analog-to-digital converter having the proposed circuit structure falls within the scope of the present invention.

By way of example, but not limitation, the error input $E_{IN}$ may be the DAC error $E_{DAC}$ introduced by the DAC 122. It should be noted that the error suppression mechanism shown in FIG. 3 is not limited to suppression of the DAC mismatch error. Specifically, in this embodiment, the DAC error $E_{DAC}$ may be a static DAC error (e.g., DAC mismatch), a dynamic DAC error (e.g., inter-symbol interference (ISI)), or an error resulting from clock jitter.

The error suppression circuit 304 includes an in-band filter 312, a decimation filter 314, and an adder 316. In this embodiment, the delta-sigma analog-to-digital converter 300 is configured to perform in-band error suppression only. Hence, the in-band filter 312 is arranged for receiving the error input $E_{IN}$, and generating a filtered error input $E_F$ according to the error signal $E_{IN}$, wherein the in-band filter 312 has an in-band frequency response with a unity gain (i.e., in-band gain≈1), while the out-of-band frequency response can be any shape. Therefore, the magnitude of error components within the in-band (i.e., the band of interest) remains intact, while magnitude of error components within the out-of-band may be reduced. Since the data rate of the error input $E_{IN}$ (which may be a digitized version of the DAC error $E_{DAC}$) is equal to the sampling rate possessed by the digital output $D_{OUT}{'}$, and the error input $E_{IN}$ and the filtered error input $E_F$ have the same data rate, the decimation filter 314 is arranged to perform decimation (sample reduction) upon the filtered error input $E_F$ to generate the output error $E_{OUT}$ having a data rate matching that of the digital output $D_{DEC}$. The adder 316 is coupled to the decimation filters 306, 314, and arranged for adding the error output $E_{OUT}$ to the digital output $D_{DEC}$. For any error (e.g., DAC error $E_{DAC}$) injected into the input of the delta-sigma modulator 102, the same error (i.e., the error input $E_{IN}$ which is a digitized version of the error) is supplied to the digital output $D_{DEC}$ through the error suppression circuit 304, thus allowing the error to be shaped by NTF of the delta-sigma modulator 102. As the details directed to realizing the error shaping by characteristics of the loop filter 114 have been described with reference to FIG. 1 and FIG. 2, further description is omitted here for brevity. Besides, as summation of the error and the digital output is performed after decimation, the adder 316 can operate under a low data rate, and the decimation filter 306 can have a reduced word length, thus reducing the hardware complexity as well as power dissipation.

In the embodiment shown in FIG. 3, the in-band filter 312 with an in-band gain close to 1 is employed to make the delta-sigma analog-to-digital converter 300 have in-band error suppression only. However, this is for illustrative purposes only, and is not meant to be a limitation of the present invention. In an alternative design, the in-band filter may be omitted. Please refer to FIG. 4, which is a diagram illustrating an oversampling delta-sigma analog-to-digital converter with error suppression according to another embodiment of the present invention. The major difference between the delta-sigma analog-to-digital converters 300 and 400 is that the error suppression circuit 404 has no in-band filter included therein. Hence, the decimation filter 314 directly performs decimation (sample reduction) upon the error input $E_{IN}$, and accordingly generates the error output $E_{OUT}$ to the adder 316. The same objective of allowing any error (e.g., DAC error $E_{DAC}$) injected into the input of the delta-sigma modulator 102 to be shaped by NTF of the delta-sigma modulator 102 is achieved.

Figure 4:
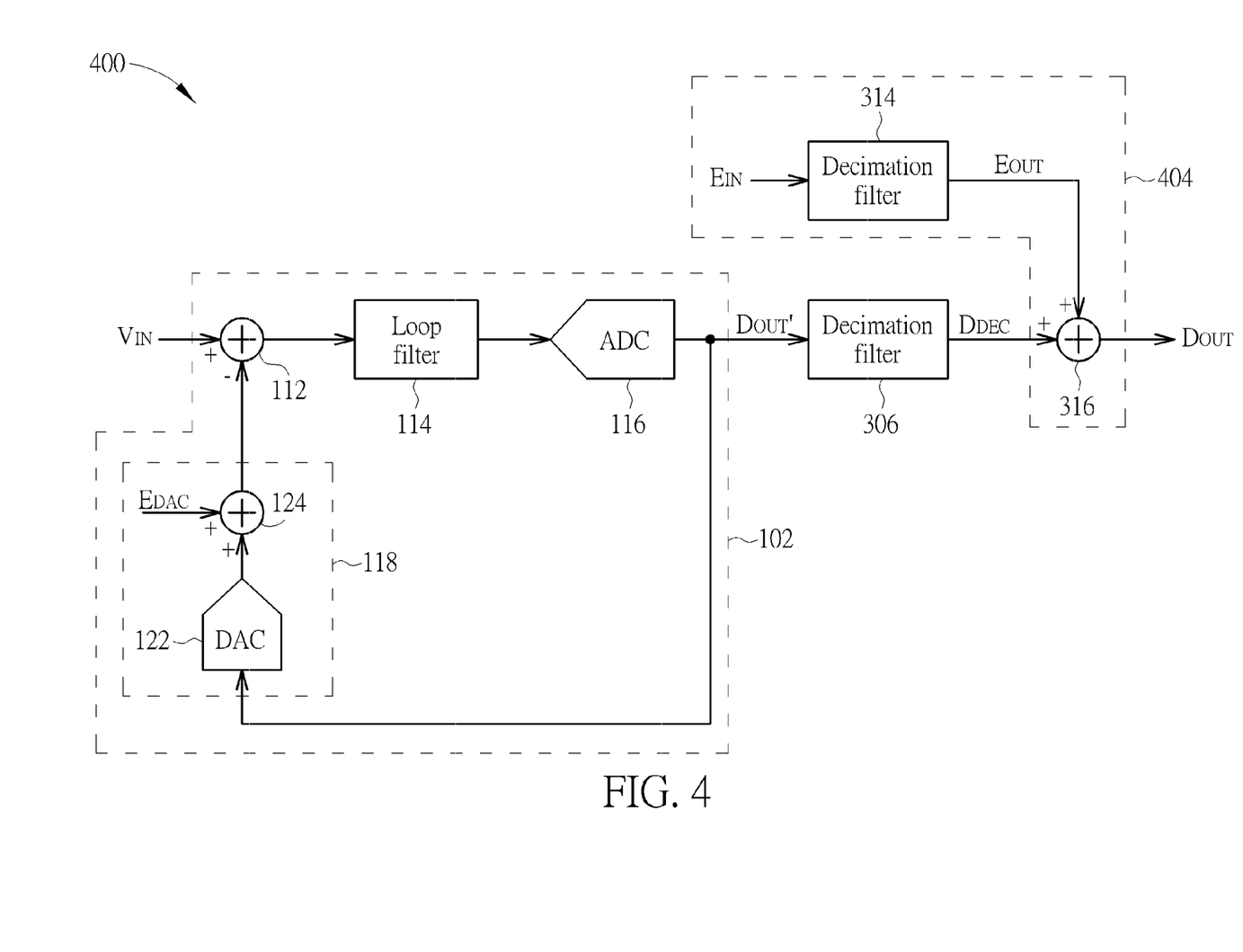
FIG. 4 is a diagram illustrating an oversampling delta-sigma analog-to-digital converter with error suppression according to another embodiment of the present invention.

In the embodiments shown in FIG. 3 and FIG. 4, the digital output $D_{DEC}$ is generated by the decimation filter 306. In practice, using a single filter to realize the decimation may not satisfy requirements of all applications. Thus, the decimation filter 306 may be implemented using multiple decimation stages (i.e., multiple filters). Hence, the digital output $D_{DEC}$ may be the output of any decimation stage. In one exemplary design, the digital output $D_{DEC}$ may be the output of the last decimation stage. In another exemplary design, the digital output $D_{DEC}$ may be the output of a specific decimation stage which is not the last decimation stage. To put it another way, the digital output $D_{DEC}$ is not required to be the final decimation output of the decimation filter as shown in FIG. 3/FIG. 4, and may be any decimation output provided by the decimation filter.

Figure 5:
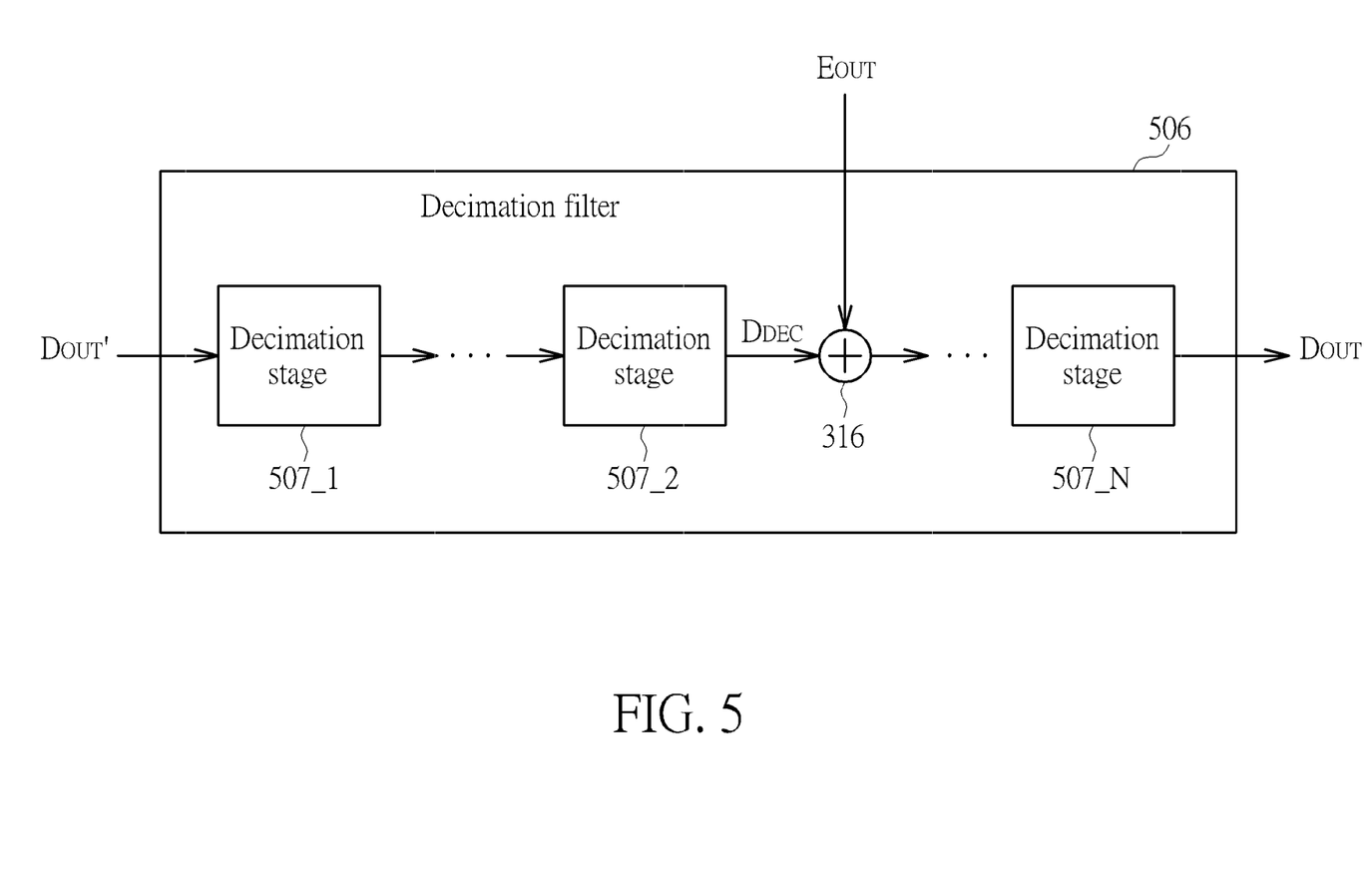
FIG. 5 is a diagram illustrating a decimation filter according to an embodiment of the present invention.

Please refer to FIG. 5, which is a diagram illustrating a decimation filter according to an embodiment of the present invention. The decimation filter 306 in FIG. 3/FIG. 4 may be implemented using the decimation filter 506 shown in FIG. 5. As shown in FIG. 5, the decimation filter 506 includes a plurality of cascaded decimation stages 507_1, 507_2, ..., 507_N. By way of example, but not limitation, a decimation stage may be implemented using a finite-impulse response (FIR) filter. The aforementioned digital output $D_{DEC}$ is an output of one of the cascaded decimation stages 507_1, 507_2, ..., 507_N. Regarding the embodiments shown in FIG. 3/FIG. 4, the digital output $D_{DEC}$ is the output of the last decimation stage 507_N if the decimation filter 306 is implemented using the decimation filter 506. Regarding the embodiment shown in FIG. 5, the digital output $D_{DEC}$ may be the output of the decimation stage 507_2 which is not the last decimation stage 507_N of the decimation filter 506. Hence, the error output $E_{OUT}$ generated from the error suppression circuit 304/404 is injected into the output of the decimation stage 507_2. The same objective of allowing any error (e.g., DAC error $E_{DAC}$) injected into the input of the delta-sigma modulator 102 to be shaped by NTF of the delta-sigma modulator 102 is achieved.

In above embodiments shown in FIG. 4 and FIG. 5, the error input $E_{IN}$ is an error resulting from the delta-sigma modulator 102, and is injected into a digital signal generated by the decimation filter 306/506 following the delta-sigma modulator 102. However, this is not meant to be a limitation of the present invention. That is, no matter whether a post-processing stage following the delta-sigma modulator 102 is a decimation filter or not, any delta-sigma analog-to-digital converter having the proposed circuit structure which injects the error input $E_{IN}$ resulting from the delta-sigma modulator 102 into the post-processing stage following the delta-sigma modulator 102 for error suppression falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delta-sigma analog-to-digital converter, comprising:
    a delta-sigma modulator, arranged for receiving an analog input and converting the analog input into a first digital output;
    a first decimation filter, coupled to the delta-sigma modulator, the first decimation filter arranged for generating a second digital output according to the first digital output; and
    an error suppression circuit, coupled to the first decimation filter, the error suppression circuit arranged for receiving an error input and injecting an error output into the second digital output according to the error input;
    wherein the error suppression circuit receives the error input resulting from a digital-to-analog converter (DAC) of the delta-sigma modulator, the error input comprising an inter-symbol interference (ISI) error or an error resulting from clock jitter.

2. The delta-sigma analog-to-digital converter of claim 1, wherein the first decimation filter includes a plurality of cascaded decimation stages, and the second digital output is an output of a specific decimation stage of the cascaded decimation stages.

3. The delta-sigma analog-to-digital converter of claim 2, wherein the specific decimation stage is not a last decimation stage of the first decimation filter.

4. The delta-sigma analog-to-digital converter of claim 1, wherein the error suppression circuit comprises:
    an in-band filter, arranged for receiving the error input, and generating a filtered error input according to the error signal;
    a second decimation filter, coupled to the in-band filter, the second decimation filter arranged for generating the error output according to the filtered error input; and an adder, coupled to the first decimation filter and the second decimation filter, the adder arranged for adding the error output to the second digital output.

5. The delta-sigma analog-to-digital converter of claim 4, wherein the in-band filter has an in-band frequency response with a unity gain.

6. The delta-sigma analog-to-digital converter of claim 1, wherein the error suppression circuit comprises:
 a second decimation filter, arranged for receiving the error input, and generating the error output according to the error input; and
 an adder, coupled to the first decimation filter and the second decimation filter, the adder arranged for adding the error output to the second digital output.

7. A delta-sigma analog-to-digital converter, comprising:
 a delta-sigma modulator, arranged for receiving an analog input and converting the analog input into a first digital output;
 a first signal processing circuit, coupled to the delta-sigma modulator, the first signal processing circuit arranged for adjusting the first digital output to generate a second digital output; and
 an error suppression circuit, coupled to the first signal processing circuit, the error suppression circuit arranged for receiving an error input and injecting an error output into the second digital output according to the error input;
wherein the error suppression circuit receives the error input resulting from a digital-to-analog converter (DAC) of the delta-sigma modulator, the error input comprising an inter-symbol interference (ISI) error or an error resulting from clock jitter.

8. The delta-sigma analog-to-digital converter of claim 7, wherein the first signal processing circuit is a decimation filter.

9. The delta-sigma analog-to-digital converter of claim 8, wherein the decimation filter includes a plurality of cascaded decimation stages, and the second digital output is an output of a specific decimation stage of the cascaded decimation stages.

10. The delta-sigma analog-to-digital converter of claim 9, wherein the specific decimation stage is not a last decimation stage of the decimation filter.

11. The delta-sigma analog-to-digital converter of claim 7, wherein the error suppression circuit comprises:
 an in-band filter, arranged for generating a filtered error input according to the error signal;
 a second signal processing circuit, coupled to the in-band filter, the second signal processing circuit arranged for adjusting the filtered error input to generate the error output; and
 an adder, coupled to the first signal processing circuit and the second signal processing circuit, the adder arranged for adding the error output to the second digital output.

12. The delta-sigma analog-to-digital converter of claim 11, wherein the in-band filter has an in-band frequency response with a unity gain.

13. The delta-sigma analog-to-digital converter of claim 11, wherein each of the first signal processing circuit and the second signal processing circuit is a decimation filter.

14. The delta-sigma analog-to-digital converter of claim 7, wherein the error suppression circuit comprises:
 a second signal processing circuit, arranged for adjusting the error input to generate the error output; and
 an adder, coupled to the first signal processing circuit and the second signal processing circuit, the adder arranged for adding the error output to the second digital output.

15. The delta-sigma analog-to-digital converter of claim 14, wherein each of the first signal processing circuit and the second signal processing circuit is a decimation filter.

* * * * *